United States Patent [19]

Franklin et al.

[11] 4,442,475
[45] Apr. 10, 1984

[54] TAPERED SEAL FOR FLOW-THROUGH MODULE

[75] Inventors: James L. Franklin, Kent; Ted J. Kramer, Seattle, both of Wash.

[73] Assignee: The United States of America as represented by the Secretary of the Navy, Washington, D.C.

[21] Appl. No.: 395,566

[22] Filed: Jul. 6, 1982

[51] Int. Cl.³ .............................................. H05K 7/20
[52] U.S. Cl. .................................... 361/383; 361/384; 361/415; 165/80 B
[58] Field of Search ................................ 361/382–384, 361/385, 386, 393–395, 415; 165/80 A, 80 B, 80 D, 104.33; 62/418

[56] References Cited

U.S. PATENT DOCUMENTS

| | | | |
|---|---|---|---|
| 2,187,011 | 1/1940 | Braden | 62/442 |
| 2,816,582 | 12/1957 | Sneidern | |
| 2,999,699 | 9/1961 | Lafferty | 285/110 |
| 3,243,660 | 3/1966 | Yuska | 165/185 |
| 3,382,476 | 5/1968 | Novet | 339/65 |
| 3,495,132 | 2/1970 | Anhalt et al. | 361/384 |
| 3,942,586 | 3/1976 | Fries | 165/122 |
| 3,956,673 | 5/1976 | Leid | 361/383 |
| 3,975,805 | 8/1976 | Spurling et al. | 24/248 R |
| 4,044,515 | 8/1977 | Hollingsead et al. | 52/173 R |
| 4,230,325 | 10/1980 | Butler et al. | 277/117 |
| 4,277,815 | 7/1981 | Skroupa | 361/383 |
| 4,315,300 | 2/1982 | Parmerlee et al. | 361/382 |
| 4,375,290 | 3/1983 | Zucchi | 361/415 |

*Primary Examiner*—G. P. Tolin
*Attorney, Agent, or Firm*—Robert F. Beers; Paul S. Collignon

[57] ABSTRACT

Tapered seals are provided for sealing the ends of a flow-through module which is mounted in parallel guide rails. Each seal is bonded to the end of a heat exchanger core and is a rectangular wedge having a thinner end at the bottom and a thicker end at the top. A complimentary tapered surface is provided in each slot of a plurality of slots in the parallel guide rails and, when an electronic module is inserted into the guide rails, a wedging action takes place to firmly position a module in the guide rails and seal the air passageway in the heat exchanger core to the guide rails.

4 Claims, 3 Drawing Figures

TAPERED SEAL FOR FLOW-THROUGH MODULE

BACKGROUND OF THE INVENTION

The present invention relates to an improved sealing arrangement in an air-cooled electronic module, and more particularly to a sealing arrangement for a modular avionics package which is cooled by flowing air through a module frame.

There is a constant demand for smaller electrical and electronic components, particularly in the aircraft and missile fields, as weight is of extreme importance. One concept of microelectronics which has been recently developed and which offers a great reduction in size and weight of electronic units is that of integrated circuitry which is formed on insulated bases such as glass, fused silica, or ceramic substrates. Integrated circuitry includes a number of active and passive components which are fabricated by one or more of a combination of several thin film deposition techniques onto a glass or ceramic substrate.

In order to reduce costs, expedite production, and provide a reliable electronic component, a standard hardware program has been formulated in which electronic plug-in modules have been developed which are capable of meeting various system requirements. One such plug-in module is shown in U.S. Pat. No. 3,243,660, entitled "Electronic Module Assembly", which issued Mar. 29, 1966, to Leonard J. Yuska and David P. Zimmerman.

One concept of a standard hardware program is to have a plurality of modules which plug in a chassis to form an assembly and normally these plug-in modules slide in grooves or ways in the chassis and engage a mating female connector. These modules are closely assembled and dissipate considerable thermal energy which, if not removed, greatly affects component reliability.

Various attempts have been made to cool electronic assemblies and generally employ some type of cooling coil and fan assembly. One such device is shown in U.S. Pat. No. 2,187,011, entitled, "Cooling Means For An Electrical Apparatus", which issued Jan. 16, 1940, to Paul F. Braden. In one embodiment of this patent, a fan blows air over a cooling coil and the air passes successively through three shelves which support vacuum tubes and other electrical components. The disadvantage of such an arrangement, however, is that the first shelf receives cool air, which is heated by the electrical components, and the last shelf receives hot air and experiences little or no cooling effect.

In U.S. Pat. No. 3,942,586, entitled, "Cooling Arrangement For Flat Semiconductor Components", which issued Mar. 9, 1976, to Paul Fries, the inventor recognized a need for cooling all the mounted components. He stated that there is a need for an improved cooling arrangement for stacked flat semiconductors which can: (1) take advantage of the benefits of the heat pipe; and (2) in addition, provide adequate cooling to the semiconductors no matter what their location is within the column or stack. That is, the problem is to provide an arrangement in which cooling air of essentially the same temperature can flow over all the heat pipes in such an arrangement. The solution proposed was to axially align the semiconductor components, with the axes of the heat pipes of the cooling elements which are located one over the other, arranged so that they are rotationally displaced with respect to each other about the stack axis.

In U.S. Pat. No. 4,315,300, which issued Feb. 9, 1982, to James K. Parmerlee and B. Dale Tague, an improved cooling arrangement is shown for an electronic plug-in module assembly having a plurality of modules supported in grooves in a pair of parallel sides. Each parallel side is provided with fluid passageways for carrying a cooling liquid for removing heat transferred from a heat sink on each module to the sides. A plurality of apertures are provide in each side between adjacent grooves and carry fins through which cool air is blown to cool each side of each plug-in module. One disadvantage of such and arrangement, however, is that the cooling air flowing over the electronic components presents a corrosion problem.

SUMMARY OF THE INVENTION

The present invention relates to tapered seals for sealing the ends of a flow-through module which is mounted in parallel guide rails. The module has a heat exchanger core which is mounted in a slot passing through the module, and a seal of pliable material is bonded to each end of the heat exchanger core. Each seal is a rectangular wedge having a thinner end at the bottom and a thicker end at the top. A rectangular slot is provided in the seal for passage of air. Each guide rail has a plurality of slots for supporting the electronic modules, and each slot has a tapered surface which is complimentary to the tapered surface of a seal, that is, the slot is wider at the bottom and thinner at the top. When an electronic module is inserted into the guide slots, a wedging action takes place to firmly position a module in the guide rails and also to seal the air passageway in the heat exchanger core to the guide rails.

It is therefore a general object of the present invention to provide an improved air seal for mounting a flow-through electronic module in supporting guide rails.

Other objects and advantages of the present invention will become apparent from the following detailed description of the invention when considered in conjunction with the accompanying drawing.

DESCRIPTION OF THE PREFERRED EMBODIMENT

Figure 1:
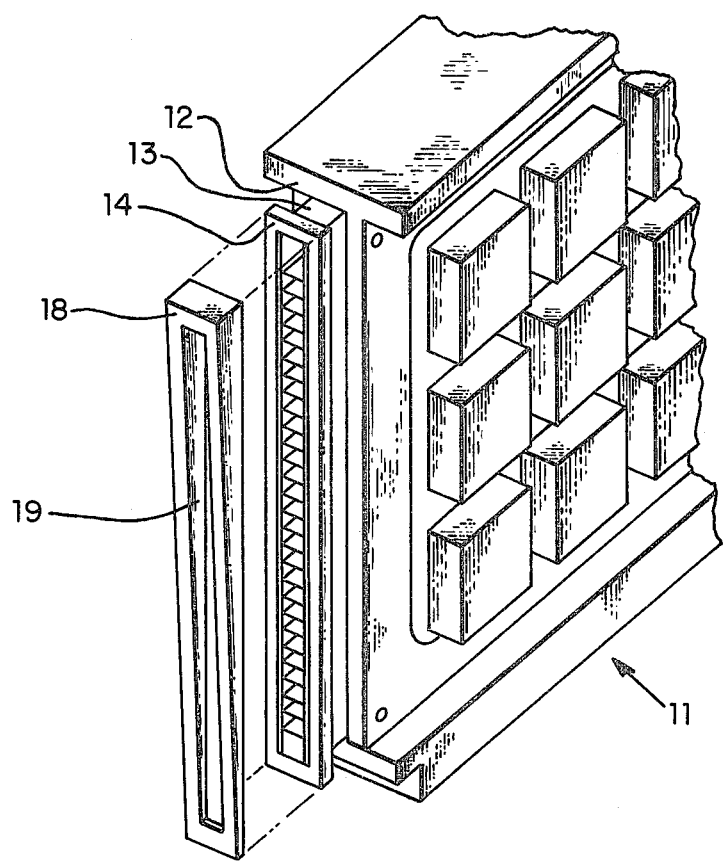
FIG. 1 is an exploded isometric view of a preferred embodiment of the present invention.
Figure 2:
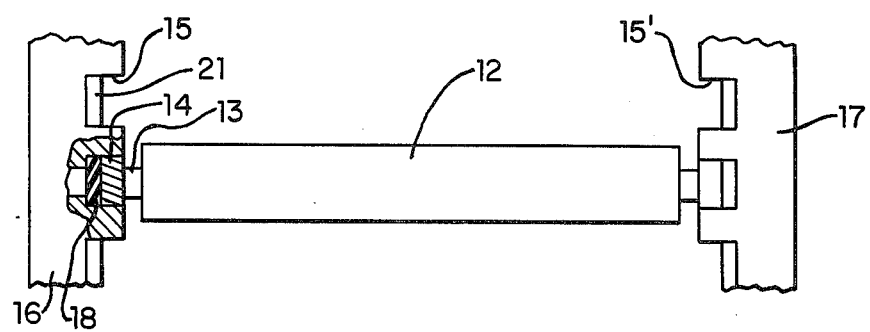
FIG. 2 is a partial top view showing a module supported in parallel side plates.
Figure 3:
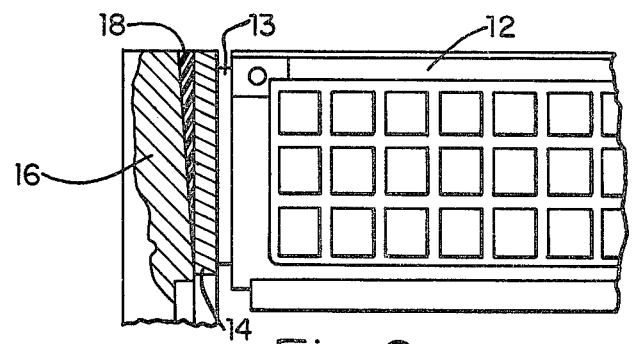
FIG. 3 is a partial front view, partly broken away, of a preferred embodiment.

Referring now to the drawing, there is shown a module 11 of the flow-through type having a heat sink 12. A heat exchanger core 13 is positioned in a passage through heat sink 12 and is designed so that air can flow through heat exchanger core 13. A module core end frame 14 is provided on each end of heat exchanger core 13. As best shown in FIG. 2 of the drawing, the width of end frame 14 is such that it will slide in a groove 15 in a side plate. As shown, a pair of parallel side plates 16 and 17 are provided and each has a plurality of grooves 15 so that a multiple number of modules can be supported.

A seal 18 of pliable material, such as silicone rubber, is bonded to the outer face of each end frame 14. Seal 18 is rectangular in shape and has a rectangular opening 19 through which air can pass. Seal 18 is wedge-shaped with the bottom having a thin thickness and the top having a wider thickness. Each groove 15 has a face 21 which is complementary in shape to the wedge-shape of seal 18, that is, the face tapers from a wide portion down to a narrow portion. As best shown in FIG. 2 of the drawing, when a module 1 is fully positioned in side plates 16 and 17, seals 18 provide an airtight seal between module 11 and the side plates which support the module. To facilitate insertion of the module into the electronic assembly, a low friction coefficient material such as Teflon may be applied or bonded to the outer face of the seal, or to the face 21 of the guide rail slot.

In operation, heat from electronic components of module 11 is transferred, by conduction to heat sink 12 and air passing through heat exchanger core 1 carries the heat away from the module. The flowing air is confined and does not come into contact with the electronic components of the module.

Obviously many modifications and variations of the present invention are possible in the light of the above teachings. It is therefore to be understood that the invention may be practiced otherwise than as specifically described.

We claim:

1. In a modular electronic system having a plurality of electronic modules each having a metallic frame with the ends of each said metallic frame being slidably mounted in opposed grooves in first and second parallel side plates, an improvement comprising, a heat exchanger core said metallic frame, a tapered seal on each end of said heat exchanger core, said tapered seal having an opening therethrough, a complementary tapered surface on a face in each groove whereby said tapered seal wedges said electronic module in said groove and provides an air seal between said electronic module and said side plates, and means for passing cooling air through said heat exchanger core.

2. In a modular electronic system as set forth in claim 1 wherein said tapered seal is bonded to an end of said heat exchanger core.

3. In a modular electronic system as set forth in claim 1 wherein said tapered seal is made of resilient material.

4. In a modular electronic system as set forth in claim 3 wherein said resilient material is silicone rubber.

* * * * *